United States Patent [19]

Rabjohn et al.

[11] Patent Number: 5,867,061
[45] Date of Patent: Feb. 2, 1999

[54] TRANSFORMER COUPLED STACKED POWER AMPLIFIER

[75] Inventors: Gordon G. Rabjohn, Ottawa; Mark S. Suthers, Lanark; John McRory, Calgary; Robert Leroux, Ottawa, all of Canada

[73] Assignee: Northern Telecom Limited, Montreal, Canada

[21] Appl. No.: 760,070

[22] Filed: Dec. 4, 1996

[51] Int. Cl.$^6$ ............................... H03F 3/68; H03F 3/26
[52] U.S. Cl. ...................................... 330/124 R; 330/276
[58] Field of Search ............................... 330/59, 124 R, 330/165, 276, 301, 310, 295

[56] References Cited

U.S. PATENT DOCUMENTS

| | | | |
|---|---|---|---|
| 4,275,360 | 6/1981 | Gill et al. | 330/276 |
| 4,816,784 | 3/1989 | Rabjohn | 333/24 R |
| 5,264,803 | 11/1993 | Mayfield | 330/124 R |

OTHER PUBLICATIONS

Carlos Galup–Montoro, et al., "Series–Parallel Association of FET's for High Gain and High Frequency Application", Sep. 1994, IEEE Journal of Solid–State Circuits, vol. 29 No. 9, pp. 1094–1100.

M. Shifrin et al., "A New Power Amplifier Topology With Series Biasing and Power Combining of Transistors", May 1992, IEEE Microwave and Millimeter–Wave Monolithic Circuit Symposium, pp. 39–41.

E.M. Cherry and D.E. Hooper, "Amplifying Devices and Low–Pass Amplifier Design", pp. 883–884.

Derwent World Patent Search, 007013475 WPI Acc. No.: 87–013472/02, Abstract for Soviet Union Patent No. 1,231, 575.

Derwent World Patent Search, 001439025 WPI Acc. No.: 76–A1908X/01, Abstract for Soviet Union Patent No. 468, 350.

*Primary Examiner*—Steven Mottola

[57] ABSTRACT

A stacked power amplifier is provided in which an input signal is independently coupled to each of a series of amplifying devices in the stack. A transformer is used at the input circuit of each device to create an RF swing across each amplifying device which is substantially equal. This results in an equal distribution of RF and DC voltage among the devices in the stack.

17 Claims, 4 Drawing Sheets

TRANSFORMER COUPLED STACKED POWER AMPLIFIER

FIELD OF THE INVENTION

The invention relates to stacked power amplifiers.

BACKGROUND OF THE INVENTION

High power amplifiers are often designed by combining active devices in parallel. A number of devices combined in parallel behave electrically similar to one larger device and can be used in a similar manner. A major difficulty with existing techniques for combining devices in parallel is that they increase only the maximum operating current, not the voltage.

A further disadvantage with existing designs is that the output impedance (both the actual impedance seen looking into the output, and the impedance required for maximum power or efficiency) is related to the voltage and current such that it decreases for large numbers of devices combined in parallel. For low frequency applications, this is not a problem, but for RF applications where it is mandatory to drive a load on the order of 50 ohms, it is an important consideration, as low loss matching networks that can transform low impedances to 50 ohms are difficult to realize. Compounding this problem is the fact that higher frequency devices need smaller geometries (for example, base width, or channel length) to achieve high gain. These small geometries tend to reduce device breakdown voltage, so for a given output power, the output impedance decreases even further.

One existing method of overcoming these problems is to connect the devices in series, or to make a combination of series and parallel connections. Specifically, the devices are placed so that the Emitter-Collector (or Source Drain) junctions are in series, sharing the power supply voltage. This technique has been described in "Amplifying Devices and Low-pass Amplifier Design", E. Cherry, D. Hooper, published by John Wiley and Sons, Inc., New York, and has been used to a small extent at lower frequencies. In the same publication, totem pole amplifiers, or bean-stalk amplifiers have been described, but it appears that practical implementations based upon this publication have not been realized. Totem-pole amplifiers for use at microwave frequencies have been described in "A New Power Amplifier Topology and Series Biasing and Power Combining of Transistors", M. Shifrin, Y. Ayasli, P. Katzin, in the proceedings of the 1992 Microwave and mm-wave Monolithics Symposium.

Another widely used attempt to solve these problems is the "Cascode" configuration in which a "top" device is driven only through the "common" terminal. This has been described in "Electronic Devices and Circuit Theory" by R. Boylestad and L. Natelsky, Prentice-Hall Inc., 1982, pages 334–335.

A problem with some of the existing stacked amplifiers referred to above lies in the drive of the base (or gate) of certain of the amplifiers in the stack. The drive of the bottom device is not a problem as an input signal is connected directly to the device. The next device up is more difficult to drive because the drive voltage must be referenced to the emitter (or source) of that device, but this electrode already has a high RF swing on it due to its connection to the bottom device. The next device is even more difficult to drive.

SUMMARY OF THE INVENTION

It is an object of the invention to provide a stacked amplifier which obviates or mitigates some of the above mentioned problems and disadvantages.

According to a first broad aspect, the invention provides a stacked amplifier having an input and an output for connection across an output load comprising a stack of sequentially connected amplifying devices including at least a bottom device and a top device, each amplifying device having a drive terminal, the output load being connected in parallel or in series with the stack; for each amplifying device an isolating means for independently connecting the drive terminal on the device to the input; whereby an RF signal applied at the input results in a substantially equal RF swing appearing across each of the amplifying devices.

Advantages realized to varying degrees with the stacked arrangement according to the invention include a reduction of output matching requirements, higher efficiency, broader bandwidth, smaller size, and reduced delay. The invention makes the use of low breakdown, high performance devices more practical thereby enabling higher gain, higher power, higher linearity, and higher efficiency.

BRIEF DESCRIPTION OF THE DRAWINGS

A preferred embodiment of the invention will now be described with reference to the attached drawings in which.

DETAILED DESCRIPTION OF THE PREFERRED EMBODIMENT

Figure 1:
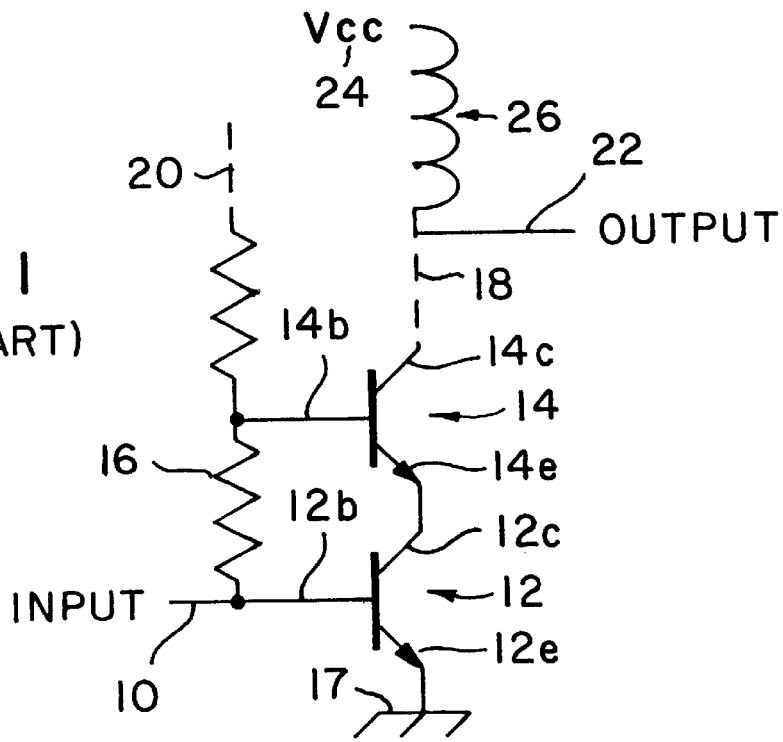
FIG. 1 is a schematic of a known stacked power amplifier.

Referring firstly to FIG. 1, a known stacked power amplifier will be described. An input 10 is connected directly to the base 12b of a bottom transistor 12 and is also connected to the base 14b of a second transistor 14 through resistor 16. The emitter 14e of the second transistor 14 is connected to the collector 12c of the bottom transistor 12 and the emitter 12e of the bottom transistor 12 is connected to a ground node 17. Additional transistors (indicated by dotted line 18) and resistors (indicated by dotted line 20) may be similarly stacked above transistor 14 and resistor 16. An output 22 is connected to the collector of the top transistor in the stack (not shown) and to a supply voltage Vcc 24 through a bias inductor 26.

The input 10 is connected directly to the base of the bottom transistor 12 and as such there is no problem driving this transistor. However, it is difficult to drive the second transistor 14 because the drive voltage on base 14b is referenced to the output on collector 12c of the bottom transistor 12 which already has a large RF swing. This will result in an unequal sharing of voltage across the transistors, with one device (usually the bottom one) taking most of the voltage swing and most of the stress. The problems encountered with driving the base of transistors other than the bottom transistor 12 may be explained with reference to a mechanical analogy. Picture a toy car located on a toy train, the train located on a track. It is not difficult for a person standing beside the track to make the train move. However, if the train is moving quickly, it is more difficult for the person standing beside the track to make the car move relative to the train in the same direction as the train. The person's arm must be moving at least the train's velocity just to keep up.

Figure 2:
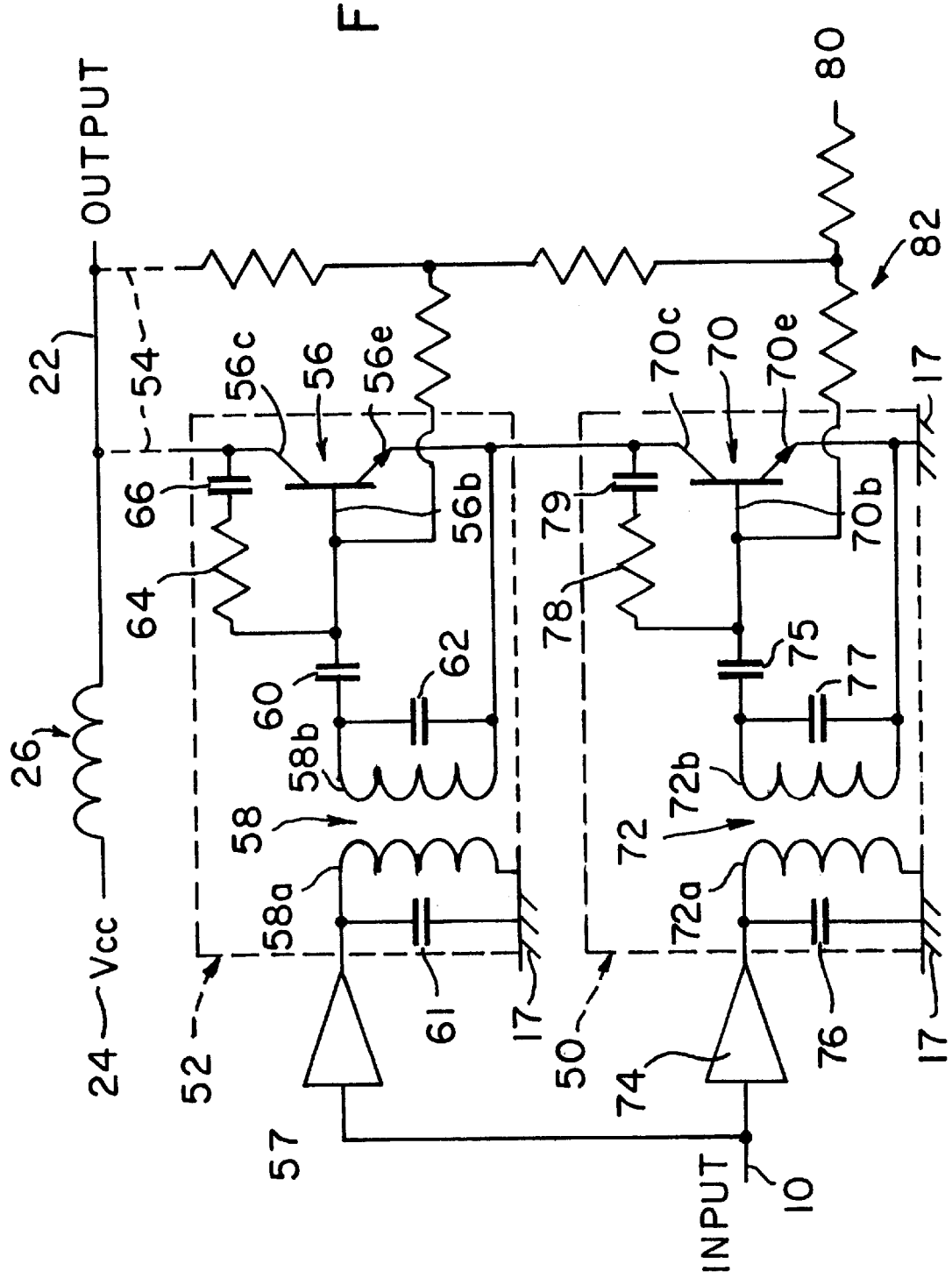
FIG. 2 is a schematic of a stacked power amplifier according to an embodiment of the invention.

Referring now to FIG. 2, a stacked amplifier according to the invention which overcomes the above disadvantages is shown schematically. The embodiment illustrated includes two stacked amplifier sections 50,52 with additional sections, if present, indicated by dotted lines 54. The amplifier sections include a top section and a bottom section. The amplifier sections 50,52 have amplifying devices which in the illustrated embodiment are transistors 70,56. The amplifier sections 50,52 also each have an isolation device for connecting an input to a drive terminal of each amplifying device in an isolated manner. In the illustrated embodiment the isolation devices are transformers 72,58 respectively.

Transistor 56 of amplifier section 52 has a collector 56c connected to the emitter of a subsequent section (not shown) or to supply voltage Vcc 24 through bias inductor 26 if transistor 56 is in the top section. Transistor 56 has an emitter 56e connected to the collector 70c of the previous transistor 70. Input 10 is coupled to a primary winding 58a of transformer 58 through an amplifier or buffer 57. One end of the primary winding 58a is connected to ground node 17. One end of a secondary winding 58b of the transformer 58 is connected through a DC blocking capacitor 60 to the base 56b of transistor 56 and the other end of the secondary winding 58b is connected to the junction of emitter 56e and collector 70c. Base 56b is the drive terminal for transistor 56. Capacitors 61,62 are connected in parallel with the primary and secondary windings 58a, 58b respectively of transformer 58 to compensate for non-ideal transformer characteristics. A feedback circuit consisting of a resistor 64 and a capacitor 66 is connected between the base 56b and the collector 56c. This feedback circuit improves the stability of the amplifier.

Transistor 70 of amplifier section 50 has a collector 70c connected to the emitter 56e of transistor 56 in subsequent section 52. Transistor 70 has an emitter 70e connected to the ground node 17. Input 10 is coupled to a primary winding 72a of transformer 72 through an input amplifier or buffer 74. One end of primary winding 72a is connected to ground. One end of a secondary winding 72b of the transformer 72 is connected through a DC blocking capacitor 75 to the base 70b of transistor 70 and the other end of the secondary winding 72b is connected to ground 17. Base 70b is the drive terminal for transistor 70. Capacitors 76,77 are connected in parallel with the primary and secondary windings 72a, 72b of transformer 72 respectively to compensate for non-ideal transformer characteristics. A feedback circuit consisting of a resistor 78 and a capacitor 79 is connected between the base 70b and the collector 70c. As before, this feedback circuit improves the stability of the amplifier.

An output 22 is connected to the collector of the top transistor in the stack and to the supply voltage Vcc 24 through the bias inductor 26. A base bias supply 80 is connected to the base of each of the transistors through a resistor ladder structure 82 which may be connected at its top to voltage output 22 or the supply Vcc 24. The resistor ladder structure 82 divides the output voltage 22 or supply voltage Vcc 24 into equal voltage differences across each device. The base bias supply 80 is preferably a carefully stabilized, temperature compensated power supply.

In use, a signal to be amplified is applied to the input 10 which simultaneously drives each of the transformers 58,72.

An RF swing appears across the base emitter junction of the bottom transistor 70 which results in an amplified signal appearing on the collector 70c of the bottom transistor 70. This is used as a reference at the emitter 56e of the next transistor 56. The transformer creates a drive at the base 56b of the next transistor 56 such that the RF swing on the base emitter junction of transistor 56 is the same as that which exists on the base-emitter junction of transistor 70.

By using a separate transformer to couple the input signal into each transistor, each transistor is driven at the same level and will take an equal share of the total supply voltage. Without the transformer, each amplifier in the stack would be driven with a signal having the same phase and amplitude relative to the ground node. With the transformers, each transistor in the stack is driven with a signal having the same phase and amplitude when referenced to the common node of each section. In the illustrated embodiment, the common node of each section is the emitter. The transformer serves to provide DC isolation, and allows the incoming signal to be referenced to the emitters of each amplifier in the stack. The impedance through which the bulk of the current travels is the same for each amplifier in the stack, and therefore, the voltage drop, current flow, and power dissipation of each amplifier in the stack will be the same.

The buffer amplifiers at the input to the transformers provide some isolation between the inputs to the upper most devices in the stack and the lower devices. Since the upper devices operate with a higher voltage swing than the lower ones, any stray, parasitic leakage from the upper device getting into the lower device could result in instability. Although the illustrated embodiment uses buffer amplifiers to achieve this end, other methods of providing isolation, such as "Wilkinson splitters" for example, would also work. In cases where the differing effects of stray capacitance are not significant, the inputs may be simply connected together.

In the illustrated embodiment, one end of each of primary transformer windings 58a, 72a is connected to the ground node 17, but this is not essential.

In theory, a stacked power amplifier according to the invention would be designed to have an identical drive on each section, and each section would be identical to each other. However, in practice it has been found that a stray capacitance to ground of the upper section has a larger effect than an identical capacitance on a lower section, resulting in a different RF swing appearing across each section. To compensate for this, various approaches may be taken. One approach is to use a transformer having a smaller transformer capacitance either in all of the sections or just in the upper sections. Another approach is to compensate for the difference in capacitance by adding loss or gain to each element of the stack so that each section has the same RF swing despite the difference in capacitance. In another approach, shielding and guard rings may be employed to minimize the stray capacitance. In yet another approach, a capacitor from some other node in the circuit may be used to compensate out the stray capacitance. This is particularly useful in push-pull circuits where nodes with opposite phase are readily available.

Figure 3:
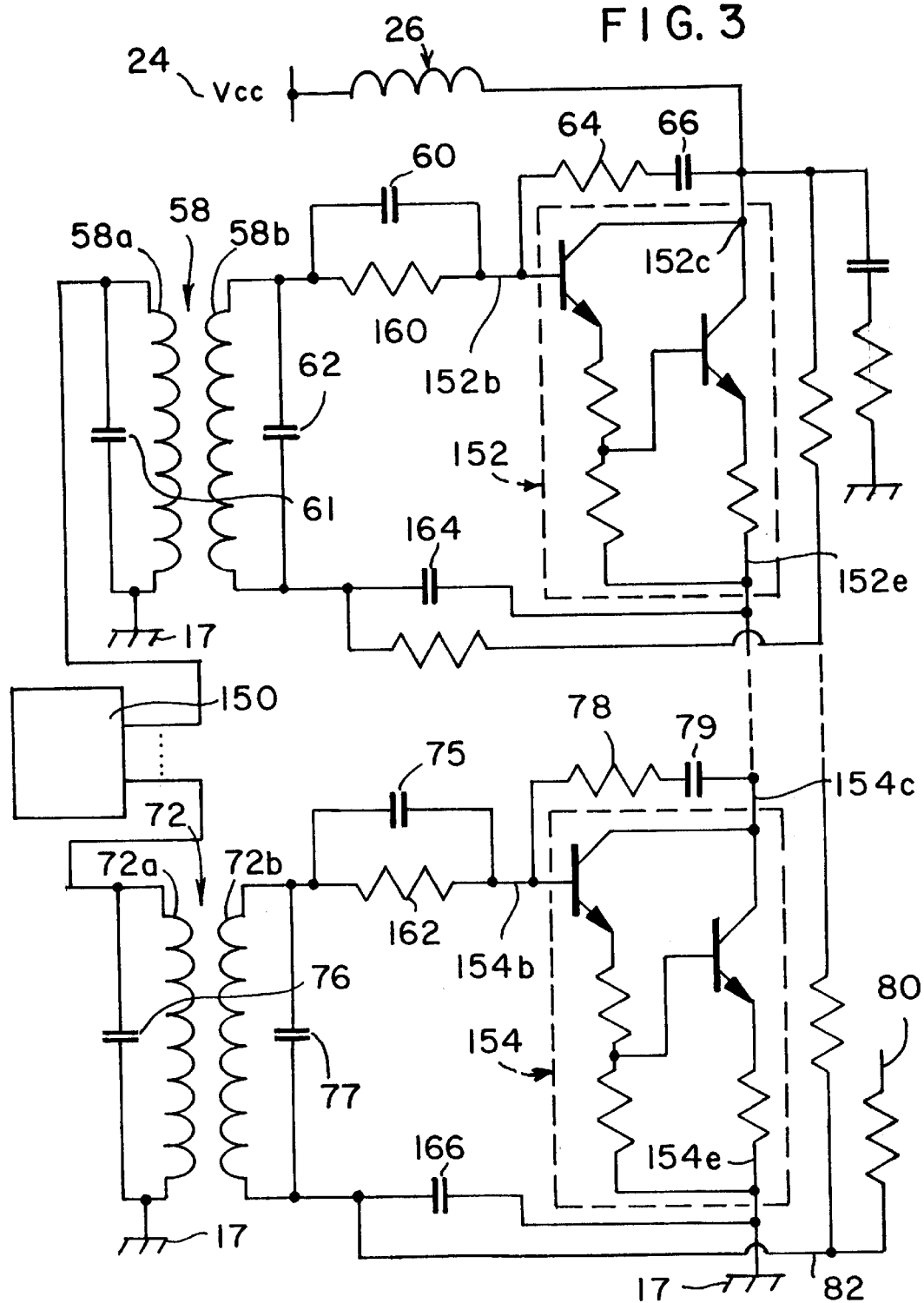
FIG. 3 is a schematic of a another stacked power amplifier according to an embodiment of the invention.

Referring now to FIG. 3, another embodiment of a stacked amplifier according to the invention will now be described. This embodiment is the currently best known implementation of the invention. Most of the components illustrated in FIG. 3 either also exist in FIG. 2, or are analogous to components in FIG. 2. Components which appear in both FIGS. 2 and 3 are identically labelled and their description will not be repeated here. Differences exist in the type of input isolation device, the type of amplifying device, and in the biasing ladder. These differences will now be detailed.

Rather than the buffer amplifiers 57,74 of FIG. 2 to provide input isolation at the input to the transformers 58,72, a Wilkinson splitter 150 is used. Rather than using single transistors 56,70 in the amplifier sections, Darlington pairs 152,154 are used. Darlington pair 152 effectively has a base 152b, an emitter 152e and a collector 152c which function in place of the base 56b, emitter 56e, and collector 56c of transistor 56 in the FIG. 2 embodiment. Similarly, Darlington pair 154 effectively has a base 154b, an emitter 154e and a collector 154c which function in place of the base 70b, emitter 70e, and collector 70c of transistor 70 in the FIG. 2 embodiment. An additional resistor 160,162 is connected in parallel with each of capacitors 60,75 respectively. The RC networks consisting of capacitor 60, resistor 160 and capacitor 75, resistor 162 add stability. The biasing ladder 82 is connected slightly differently with connections made to the bottom of the transformer secondaries 58b,72b rather than to the bases 56b,70b. Two additional capacitors 164,166 connect the effective emitters 152e, 154e to the bottom of the transformer secondaries 58b,72b. These capacitors 164, 166 perform a DC blocking role where in the previous embodiment capacitors 60,75 performed a DC blocking role. This embodiment has more stable operating characteristics than the embodiment described with reference to FIG. 2.

Numerous modifications and variations of the present invention are possible in light of the above teachings. It is therefore to be understood that within the scope of the appended claims, the invention may be practised otherwise than as specifically described herein.

Although the invention has been described with reference to the drawings in which Bipolar Junction Transistors or Darlington pairs are used for the active devices, other active device types such as Field Effect Transistors or combinations of device types could be used. Each individual device could be a combination of devices such as a two device common base/common collector topology. The use of other devices or combinations of devices may require a more elaborate biasing scheme than the ones used in the embodiments illustrated.

Figure 5:
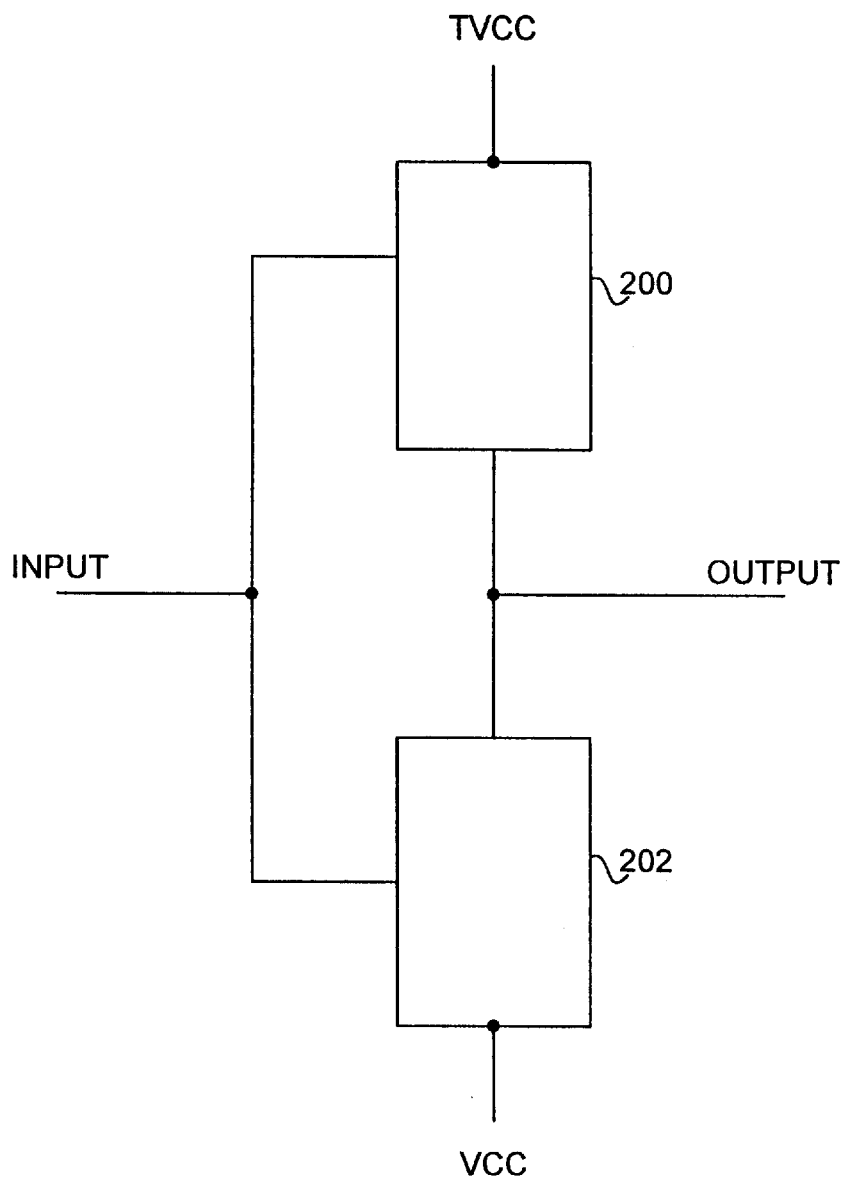

Stacked amplifiers according to the invention could also be combined in otherwise conventional ways. For example, two multi-amplifier stacked amplifiers according to the invention could be combined in a push-pull configuration. An example of this is shown in FIG. 5 in which a first stacked amplifier 200 and a second stacked amplifier 202 are each connected together in a push-pull configuration. Of course, the two stacked amplifiers 200,202 must be of complementary type, a requirement for the push-pull configuration.

There is no known fundamental height restriction on the stack. Stacks of four have been successfully implemented.

The transformers could be on-chip transformers or off-chip transformers. A particularly suitable on-chip transformer is disclosed in U.S. Pat. No. 4,816,784 to the applicant, issued Mar. 20, 1989 and titled "Balanced Planer Transformers". A fundamental function of the transformer is to isolate the ground node at the input from the common node in each section of the stack while still allowing the transfer of RF power from the main signal input to the input of each element in the stack. A transformer does this by converting electrical energy to a magnetic field and back again. In the illustrated embodiment, a coupled coil transformer has been used. Alternative types of device exist for realizing this function, for example a balun, SAW (surface acoustic wave) device, coupled line structure or optical device such as an opto-isolator or opto-coupler. A balun is a special type of transformer. A SAW device transfers electrical energy to acoustic (mechanical) energy and back again. A coupled line structure is a microwave implementation of a transformer. Optical devices transfer the electrical signal to an optical signal and back again.

Figures 4A, 4B:
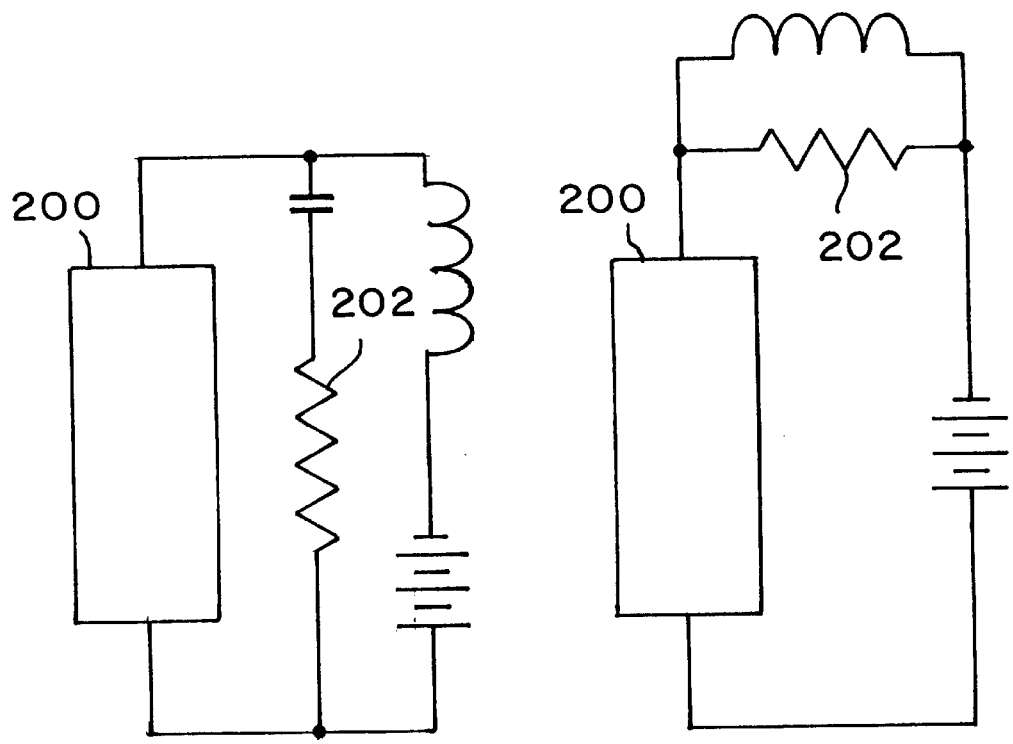
FIG. 4a is a schematic of a stacked power amplifier according to an embodiment of the invention in which a load has been connected in series with the stack.
FIG. 4b is a schematic of a stacked power amplifier according to an embodiment of the invention in which a load has been connected in parallel with the stack and FIG. 5 is a schematic of a push-pull configuration of stacked power amplifiers according to an embodiment of the invention.

There are numerous well known ways to connect a load to a stacked amplifier according the invention. Two examples are shown schematically in FIGS. 4a and 4b. In FIG. 4a, a stacked amplifier according to the invention is indicated generally by 200. A load 202 is shown connected in parallel with the stacked amplifier 200. In FIG. 4b, a load 202 is shown connected in series with the stacked amplifier 200. Other types of series and parallel connections exist and may also be used.

The embodiments of the invention in which an exclusive property or privilege is claimed are defined as follows:

1. A stacked amplifier for amplifying an input signal to produce an output signal, the stacked amplifier comprising:

a plurality of amplifier sections in a stack including a bottom section and a top section, each amplifier section comprising:

i) a transformer having a primary winding and a secondary winding, the input signal being coupled to the primary winding;

ii) a transistor having a base, a collector and an emitter, one end of the secondary winding being connected to the emitter, the other end of the secondary winding being connected through a capacitor to the base, for all transistors except the transistor in the top section the collector being connected to the emitter of the next transistor in the stack;

iii) a base bias supply connected to the base of the respective transistor;

the collector of the transistor of the top section being connected to a power supply; and the output signal being produced at the collector of the transistor of the top section.

2. A stacked amplifier according to claim 1 wherein the base bias supply of each amplifier section is connected through a resistor ladder to a common base bias supply.

3. A stacked amplifier according to claim 1 wherein the input signal is coupled to the primary winding of the transformer of each section through a respective buffer or amplifier.

4. A stacked amplifier according to claim 1 wherein the collector of the transistor of the top section is connected to the power supply through a bias inductor.

5. A stacked amplifier according to claim 1 wherein each transistor is a bipolar junction transistor.

6. A stacked amplifier for amplifying an input signal to produce an output signal across an output load, the stacked amplifier comprising:

a plurality of amplifier sections in a stack including a bottom section and a top section, each amplifier section comprising:

i) a transformer having a primary winding and a secondary winding, the input signal being coupled to the primary winding;

ii) a Darlington pair having an effective base, an effective collector and an effective emitter, one end of the secondary winding being connected to the emitter, the other end of the secondary winding being connected through a capacitor to the base, for all Darlington pairs except the Darlington pair in the top section the collector being connected to the emitter of the next Darlington pair in the stack; and iii) a base bias supply for biasing the Darlington pair; wherein:

the collector of the Darlington pair of the top section is connected to a power supply; and the output signal is produced across the stack.

7. A stacked amplifier according to claim 6 further comprising a feedback connection between the respective base and collector of each Darlington pair.

8. A stacked amplifier according to claim 7 wherein the feedback connection comprises a resistor and a capacitor connected in series.

9. A stacked amplifier according to claim 8 wherein each said base bias supply comprises a connection from the one end of the respective secondary winding through a resistor ladder to a common base bias supply.

10. A stacked amplifier according to claim 9 wherein each amplifier section further comprises a capacitor connected between the one end of the respective secondary winding to the respective emitter.

11. A stacked amplifier according to claim 10 wherein the input signal is coupled to the primary winding of the transformer of each section through a Wilkinson splitter.

12. A stacked amplifier according to claim 11 wherein the collector of the Darlington pair of the top section is connected to the power supply through a bias inductor.

13. A stacked amplifier according to claim 12 further comprising a capacitor connected across each primary winding and each secondary winding.

14. A stacked amplifier having an input for receiving an input signal and an output for producing an output signal across a load, the stacked amplifier comprising:

a) a stack of sequentially connected amplifying devices including at least a bottom device and a top device, each amplifying device having a drive terminal;

b) for each amplifying device an isolating means for independently connecting the drive terminal on the device to the input;

c) a buffer amplifier between the input and each isolating means;

whereby an RF signal applied at the input results in a substantially equal RF swing appearing across each of the amplifying devices.

15. A stacked amplifier having an input for receiving an input signal and an output for producing an output signal across a load, the stacked amplifier comprising:

a) a stack of sequentially connected amplifying devices including at least a bottom device and a top device, each amplifying device having a drive terminal;

b) for each amplifying device an isolating means for independently connecting the drive terminal on the device to the input;

c) a Wilkinson splitter connected between the input and each isolating means;

whereby an RF signal applied at the input results in a substantially equal RF swing appearing across each of the amplifying devices.

16. A stacked amplifier having an input for receiving an input signal and an output for producing an output signal across a load, the stacked amplifier comprising:

a) a stack of sequentially connected amplifying devices including at least a bottom device and a top device, each amplifying device having a drive terminal, the amplifying devices including a bipolar junction transistor;

b) for each amplifying device an isolating means for independently connecting the drive terminal on the device to the input;

c) a base bias voltage connected through a resistor ladder to a base terminal of each bipolar junction transistor;

whereby an RF signal applied at the input results in a substantially equal RF swing appearing across each of the amplifying devices.

17. An amplifier having an input for receiving an input signal and an output for producing an output signal across a load, comprising two stacked amplifiers of complementary type connected as a push-pull pair, each stacked amplifier comprising:

a) a stack of sequentially connected amplifying devices including at least a bottom device and a top device, each amplifying device having a drive terminal;

b) for each amplifying device an isolating means for independently connecting the drive terminal on the device to the input;

whereby an RF signal applied at the input results in a substantially equal RF swing appearing across each of the amplifying devices.

* * * * *